United States Patent
Brooker et al.

(10) Patent No.: US 9,037,826 B1
(45) Date of Patent: May 19, 2015

(54) SYSTEM FOR OPTIMIZATION OF INPUT/OUTPUT FROM A STORAGE ARRAY

(75) Inventors: Marc J. Brooker, Seattle, WA (US); Tate Andrew Certain, Seattle, WA (US); Roland Paterson-Jones, Cape Town (ZA)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 310 days.

(21) Appl. No.: 13/408,816

(22) Filed: Feb. 29, 2012

(51) Int. Cl.
  *G06F 12/00* (2006.01)
  *G06F 13/16* (2006.01)
  *G11C 7/22* (2006.01)

(52) U.S. Cl.
  CPC .............. *G06F 13/1689* (2013.01); *G11C 7/22* (2013.01)

(58) Field of Classification Search
  CPC ... G06F 13/1689; G06F 13/4243; G11C 7/22; G11C 7/1072; G11C 7/1066
  USPC .......................................................... 711/167
  See application file for complete search history.

(56) References Cited

U.S. PATENT DOCUMENTS

2011/0149737 A1* 6/2011 Muthiah et al. ............... 370/235

* cited by examiner

*Primary Examiner* — Yong Choe
(74) *Attorney, Agent, or Firm* — Baker & Hostetler LLP

(57) ABSTRACT

A system and method for optimizing the performance of one or more disks in a storage array in response to access requests by other computer devices and processes across a network. For requests to access to the storage disk from the network, such as a read/write request, a response monitor notes the service time for each access requests by the storage disk, and if the performance in handling the access requests fails to meet, at least, a predetermined time threshold, actions can be taken to migrate data, modify accesses permitted to the disk, or otherwise indicate underperformance.

33 Claims, 3 Drawing Sheets

SYSTEM FOR OPTIMIZATION OF INPUT/OUTPUT FROM A STORAGE ARRAY

BACKGROUND

There are extant monitoring systems for the performance of disk drives in responding to access requests, such as read and write commands. Such systems include those using input/output (I/O) error counters, SMART counters, disk throughput statistics gathering (such as the "iostat" command in Linux), and other hardware and software monitoring systems. There are many causes of low performance by failing disks including read retries from the disk medium, mechanical issues such as wear and vibration, and corrupted storage media.

However, most of the extant systems are only indicative of actual or potential disk failure and do not gauge performance in view of the execution of the incoming access requests for the disk. Disks that exhibit performance lower than an "acceptable level" can thus be deemed as "failed" even though these disks do not have any other indications of failure (e.g. SMART or I/O errors) and may still be able to perform in an operative, diminished capacity.

In large storage arrays of disks that handle I/O requests from numerous other devices and processes, the monitoring of the performance of the disks is constantly ongoing, typically with automated action removing damaged disks which either do not meet certain thresholds of acceptable performance or have failed. In typical large-scale storage systems, the determination of disk performance failure is based on aggregated disk statistics such as throughput, rate of dispatched I/O operations, await, mean service time, total service time and other measures. Due to the unpredictable nature of disk I/O patterns particularly in a large storage array handling many I/O requests, disk performance measurements based on these aggregated metrics have to trade off sensitivity in detecting short term I/O pauses within the array against a false alarm rate for potential disk failures within the array, i.e. the underperformance of several disks falsely indicating that one disk has likely failed.

DETAILED DISCLOSURE

This disclosure describes a system and method for optimizing the access performance of either a single disk volume or a storage array (RAID array or otherwise), with the storage disk accessible across a network. In one embodiment, an access controller is resident on the disk volume and receives requests for accessing the storage disks from the network, such as a read/write request, with the access request then being serviced by one or more of the plurality of storage disks. A response monitor is also resident on the disk volume and monitors the service of each access requests by the one or more of the plurality of storage disks, and the response monitor further determines the performance of the plurality of disks in handling each access requests based upon, at least, a predetermined time threshold for the handling of the access request.

In one embodiment, the response monitor, upon determining that the performance of the plurality of storage disks does not meet the predetermined threshold, causes data stored on the plurality of storage disks to be migrated such that the migrated data can be handled by disks that are able to meet the predetermined threshold, or simply to make sure that the data is backed up and available should the underperforming disk volume fail.

In another embodiment, the access requests are from a plurality of computer processes across the network, such as instantiated virtual machines, and access requests have at least two priority levels of service, e.g. must meet a specific response time for each level of service. In such an embodiment, the response monitor, upon determining that the performance of the plurality of storage disks does not meet the predetermined threshold, causes data stored in the plurality of storage disks for at least one priority level of service for access requests to be migrated to one or more other storage disks that provide access request service at least at the predetermined threshold for that priority level of service.

In a further embodiment, the response monitor, upon determining that the performance of the plurality of storage disks does not meet the predetermined threshold, simply can indicate impending disk failure within the plurality of storage disks to alert systems and personnel to take action. The response monitor can also take other actions after making such indication, as is further described herein.

Figure 1:
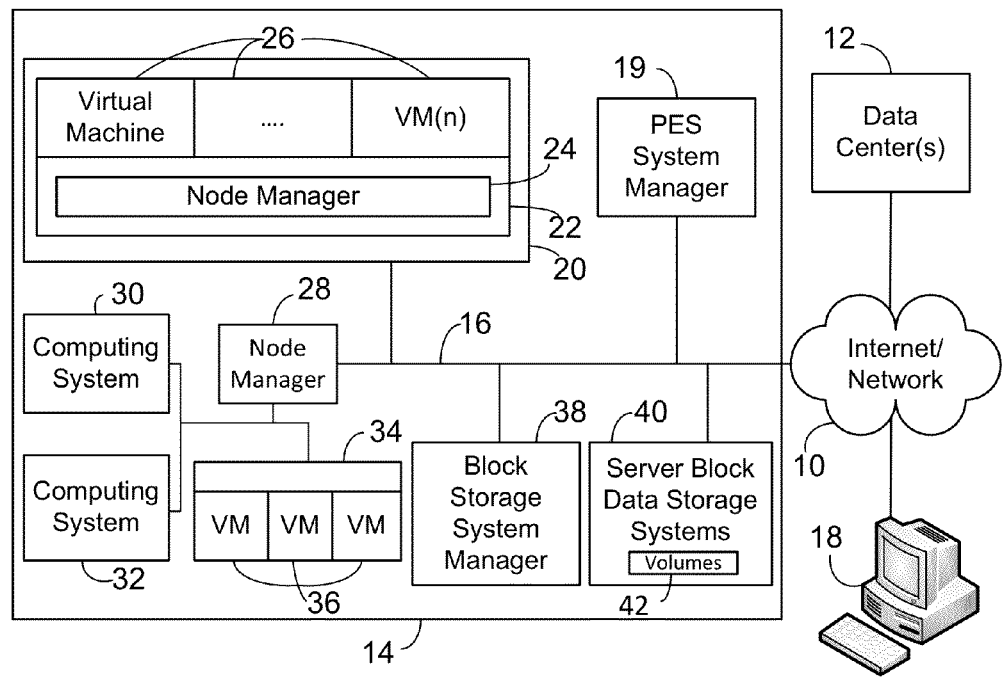
FIG. 1 is a network diagram illustrating one embodiment in which multiple computing systems execute programs and access reliable non-local block data storage in storage arrays.

FIG. 1 is a network diagram illustrating an exemplary embodiment in which multiple computing systems execute programs and access reliable networked non-local block data storage, such as under the control of a block data storage service and/or program execution service. In particular, in this example, a program execution service manages the execution of programs on various host computing systems located within a data center 14, and a block data storage service uses multiple other server block data storage systems at the data center to provide reliable non-local block data storage to those executing programs. Multiple remote archival storage systems external to the data center may also be used to store additional copies of at least some portions of at least some block data storage volumes.

Exemplary data center 14 also includes a computing system 38 that executes a Block Data Storage ("BDS") System Manager module for the block data storage service to assist in managing the availability of non-local block data storage to programs executing on computing nodes provided by the host computing systems located within the data center (or optionally on computing systems located in one or more other data centers 12, or other remote computing systems 18 external to the data center). In particular, in this example, the data center 14 includes one or more server block data storage systems 40, which each have local block storage for use in storing one or more volume copies 42. Access to the volume copies 42 is provided over the internal network(s) 16 to programs executing on computing nodes 20 and managed computer systems 30 and 32.

A BDS System Manager module may provide a variety of services related to providing non-local block data storage functionality, including the management of user accounts (e.g., creation, deletion, billing, etc.); the creation, use and deletion of block data storage volumes and snapshot copies of those volumes; the collection and processing of performance and auditing data related to the use of block data storage volumes and snapshot copies of those volumes; the obtaining of payment from customers or other users for the use of block data storage volumes and snapshot copies of those volumes; etc. In some embodiments, the BDS System Manager module may coordinate with the Node Manager modules 24 and 28 to manage use of volumes by programs executing on associated computing nodes, while in other embodiments the Node Manager modules 24 and 28 may not be used to manage such volume use. In addition, in other embodiments, one or more BDS System Manager modules may be structured in other manners, such as to have multiple instances of the BDS System Manager executing in a single data center (e.g., to share the management of non-local block data storage by programs executing on the computing nodes provided by the host computing systems located within the data center), and/or such as to have at least some of the functionality of a BDS System Manager module being provided in a distributed manner by software executing on some or all of the server block data storage systems 40 (e.g., in a peer-to-peer manner, without any separate centralized BDS System Manager module on a computing system 38).

In this example, there can be various host computing systems such as host computer node 20, server block data storage systems 40, and computing systems 30 and 32 are interconnected via one or more internal networks 16 of the data center, which may include various networking devices (e.g., routers, switches, gateways, etc.) that are not shown. In addition, the internal networks 16 are connected to an external network 10 (e.g., the Internet or other public network) in this example, and the data center 14 may further include one or more optional devices (not shown) at the interconnect between the data center 14 and an external network 10 (e.g., network proxies, load balancers, network address translation devices, etc.). In this example, the data center 14 is connected via the external network 10 to one or more other data centers 12 that each may include some or all of the computing systems and storage systems illustrated with respect to data center 14, as well as other remote computing systems 18 external to the data center. The other computing systems 18 may be operated by various parties for various purposes, such as by the operator of the data center 14 or third parties (e.g., customers of the program execution service and/or of the block data storage service). In addition, one or more of the other computing systems 18 may be archival storage systems (e.g., as part of a remote network-accessible storage service) with which the block data storage service may interact, such as under control of one or more archival manager modules (not shown) that execute on the one or more other computing systems 18 or instead on one or more computing systems of the data center 14, as described in greater detail elsewhere.

Furthermore, while not illustrated here, in at least some embodiments, at least some of the server block data storage systems 40 may further be inter-connected with one or more other networks or other connection mediums, such as a high-bandwidth connection over which the server storage systems 40 may share volume data (e.g., for purposes of replicating copies of volumes and/or maintaining consistency between primary and mirror copies of volumes), with such a high-bandwidth connection not being available to the various host computing systems, such as computing systems 30 and 32 in at least some such embodiments. It should be appreciated that the example of FIG. 1 has been simplified for the purposes of explanation, and that the number and organization of host computing systems, server block data storage systems and other devices may be much larger than what is depicted in FIG. 1.

For example, as one illustrative embodiment, there may be approximately 4000 computing systems per data center, with at least some of those computing systems being host computing systems that may each host 15 virtual machines, and/or with some of those computing systems being server block data storage systems that may each store several volume copies. If each hosted virtual machine executes one program, then such a data center may execute as many as sixty thousand program copies at one time. Furthermore, hundreds or thousands (or more) volumes may be stored on the server block data storage systems, depending on the number of server storage systems, size of the volumes, and number of mirror copies per volume. It will be appreciated that in other embodiments, other numbers of computing systems, programs and volumes may be used.

In this example, data center 14 includes one or more racks, and each rack includes a number of host computing systems such as computer node 20, as well as an optional rack support computing systems 22. The host computing nodes 20 on the rack each host one or more virtual machines 26 in this example, as well as a distinct Node Manager module 24 associated with the virtual machines on that host computing system to manage those virtual machines. One or more other host computing systems 34 also each host one or more virtual machines 36 in this example. Each virtual machine 36 may act as an independent computing node for executing one or more program copies (not shown) for a user (not shown), such as a customer of the program execution service. In addition, this exemplary data center 14 further includes additional host computing systems 30 and 32 that do not include distinct virtual machines, but may nonetheless each act as a computing node for one or more programs (not shown) being executed for a user.

In this example, a Node Manager module 28 executing on a computing system (not shown) distinct from the host computing systems 30 and 32 is associated with those host computing systems to manage the computing nodes provided by those host computing systems, such as in a manner similar to the Node Manager Module 24 for host computing node 20. A rack support computing system 22 may provide various utility services for other computing systems local to its rack (e.g., long-term program storage, metering and other monitoring of program execution and/or of non-local block data storage access performed by other computing systems local to the rack, etc.), as well as possibly to other computing systems located in the data center. Each computing system may also have one or more local attached storage devices (not shown), such as to store local copies of programs and/or data created by or otherwise used by the executing programs, as well as various other components.

In this example, an optional computing system is also illustrated that executes a program execution system ("PES System") Manager module 19 for the program execution service to assist in managing the execution of programs on the computing nodes provided by the host computing systems located within the data center (or optionally on computing systems located in one or more other data centers 12, or other remote computing systems 18 external to the data center), the PES System Manager module 19 may provide a variety of services in addition to managing execution of programs, including the management of user accounts (e.g., creation, deletion, billing, etc.); the registration, storage, and distribution of programs to be executed; the collection and processing of performance and auditing data related to the execution of programs; the obtaining of payment from customers or other users for the execution of programs; etc. In some embodiments, the PES System Manager module 19 may coordinate with the Node Manager modules 24 and 28 to manage program execution on computing nodes associated with the Node Manager modules, while in other embodiments the Node Manager modules 24 and 28 may not assist in managing such execution of programs.

Data centers housing significant numbers of co-located interconnected computing systems have become commonplace, such as private data centers that are operated by and on behalf of a single organization, and public data centers that are operated by entities as businesses. Some public data center operators provide network access, power, and secure installation facilities for hardware owned by various customers, while other public data center operators provide "full service" facilities that also include hardware resources made available for use by their customers. However, any of the components for the network 10, devices supporting the network, storage, memory and the like could be physical located separately from each other, in multiple data centers, or spread about various computer devices.

In particular regard to virtualization technologies for commodity hardware, there are several existing systems that provide some benefits with respect to managing large-scale computing resources for many customers with diverse needs, allowing various computing resources to be efficiently and securely shared between multiple customers. For example, virtualization technologies such as those provided by XEN, VMWare, or User-Mode Linux may allow a single physical computing system to be shared among multiple users by providing each user with one or more virtual machines VM1-VMN hosted by the single physical computing system, with each such virtual machine being a software simulation acting as a distinct logical computing system that provides users with the illusion that they are the sole operators and administrators of a given hardware computing resource, while also providing application isolation and security among the various virtual machines. Furthermore, some virtualization technologies provide virtual resources that span one or more physical resources, such as a single virtual machine with multiple virtual processors that actually spans multiple distinct physical computing systems.

Figure 2:
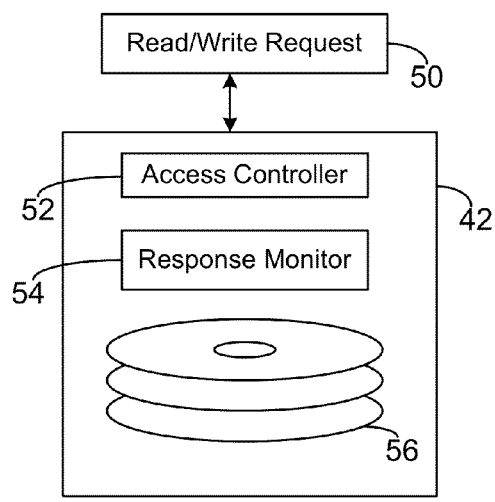
FIG. 2 is a block diagram of an individual disk storage volume present in the network of FIG. 1, with an access controller and a response monitor resident on the volume that optimize the response time of the volume within the non-local block data storage.

FIG. 2 is a block diagram of one embodiment of an individual storage volume 42 in FIG. 1, wherein a Read/Write request 50 (or other access request) is received by the storage volume 42. Resident on the disk volume 42 is an access controller 52 that receives and controls the Read/Write request 50, and a response monitor 54 is also resident on the storage volume 42 that monitors the response time of the storage volume 42 in handling the Read/Write request 50. Thus, in this embodiment, a Read/Write is made to the physical disk media 56, likely from a requesting process to the Server Block Data Storage System 40 in FIG. 1. As will further be described herein, the response monitor can be resident on the individual storage volume 42, or a node, such as Node manager 28 in FIG. 1, or on the Server Block Data Storage System 40, and the response monitor (if so embodied) can migrate through a disk array to attempt to identify the specific storage volume 42 that is underperforming.

The response monitor 54 can detect a storage volume 42 with unacceptable performance using a method which is more sensitive, more specific and more resistant than extant monitoring systems based on aggregate performance statistics of one or more storage volumes responding to I/O requests. In one embodiment, a response monitor 54 gathers I/O service times for commands sent to the disk media 56, determines acceptable thresholds (based on order statistics) from data aggregated from a population of drives in the storage array, thus dynamically adjusting the performance threshold of the access requests based upon the current performance of the storage array. Alternately, the selection of the performance thresholds can be deliberately set by a human and the response monitor 54 will then utilized the appropriate set threshold upon the access controller 52 receiving an access request. One or more of the disks can therefore be ranked based upon their ability to respond to I/O requests in relation to these statistics. The response monitor can also work in conjunction with an automated system for taking disks volumes which display excessive periods of slow I/O response times out of service.

In one embodiment, the collection of I/O times for the response monitor 54 is performed using counters exposed by the I/O layers in the operating system kernel of the storage volume 42. For example, the current "queue length" and "total number of I/O requests serviced" counters are used. The response monitor 54 monitors these counters frequently (in one embodiment, every 250 microseconds) and counts periods where the total number of I/O requests serviced is not increasing, but there are outstanding I/O requests to be serviced. These periods of time can be used in two ways: (1) collected across a population of storage drives and order statistics (such as the 99.9th or 99.99th percentiles) computed to create an acceptable I/O pause threshold T; (2) used per-drive to calculate exceedance counts and exceedance probabilities for periods when that drive (storage volume 42) experienced I/O delay above the predetermined threshold T.

Incidents of exceedance and exceedance probability at the predetermined threshold (T) are then used to determine the performance against a particular drive in the population. Because a healthy drive has an expected distribution of the handling of I/O requests with very low exceedance probabilities for high pause times, and the fact that these statistics are resistant to extreme outliers in the population, the exceedance probability of I/O pause times above an acceptable predetermined threshold can be used to form a test which has a higher sensitivity to drive performance issues than simple aggregated statistics, while also having a higher specificity against false positives. Thus, when an individual storage volume 42 fails this test through having exceedance counts or exceedance probabilities that are excessive, that storage volume 42 can have data migrated therefrom, and/or be automatically removed from use by an automated system, depending upon the particular embodiment.

It should be noted that the multiple performance thresholds for a storage volume 42 could be set such that the lowest threshold indicate likely disk failure should the threshold not be met. In such manner, the action taken in response to a threshold failure can be specifically designed for the failure, e.g. start migration of data from the storage volume at failure to meet a first threshold, and then shut the storage volume down upon failure to meet a lower threshold. Furthermore, a dynamic threshold can be occurring based on storage array performance and a lower limit performance threshold can be set by a human such that different actions can be taken on failure to meet the different thresholds, e.g. change the priority level of access requests handled if the dynamic performance threshold is breached, and then cause migration of the data from the storage volume 42 once the lower preset performance threshold has been breached. In such manner, the full potential operability of a storage volume 42 may be used prior to failure.

Figure 3:
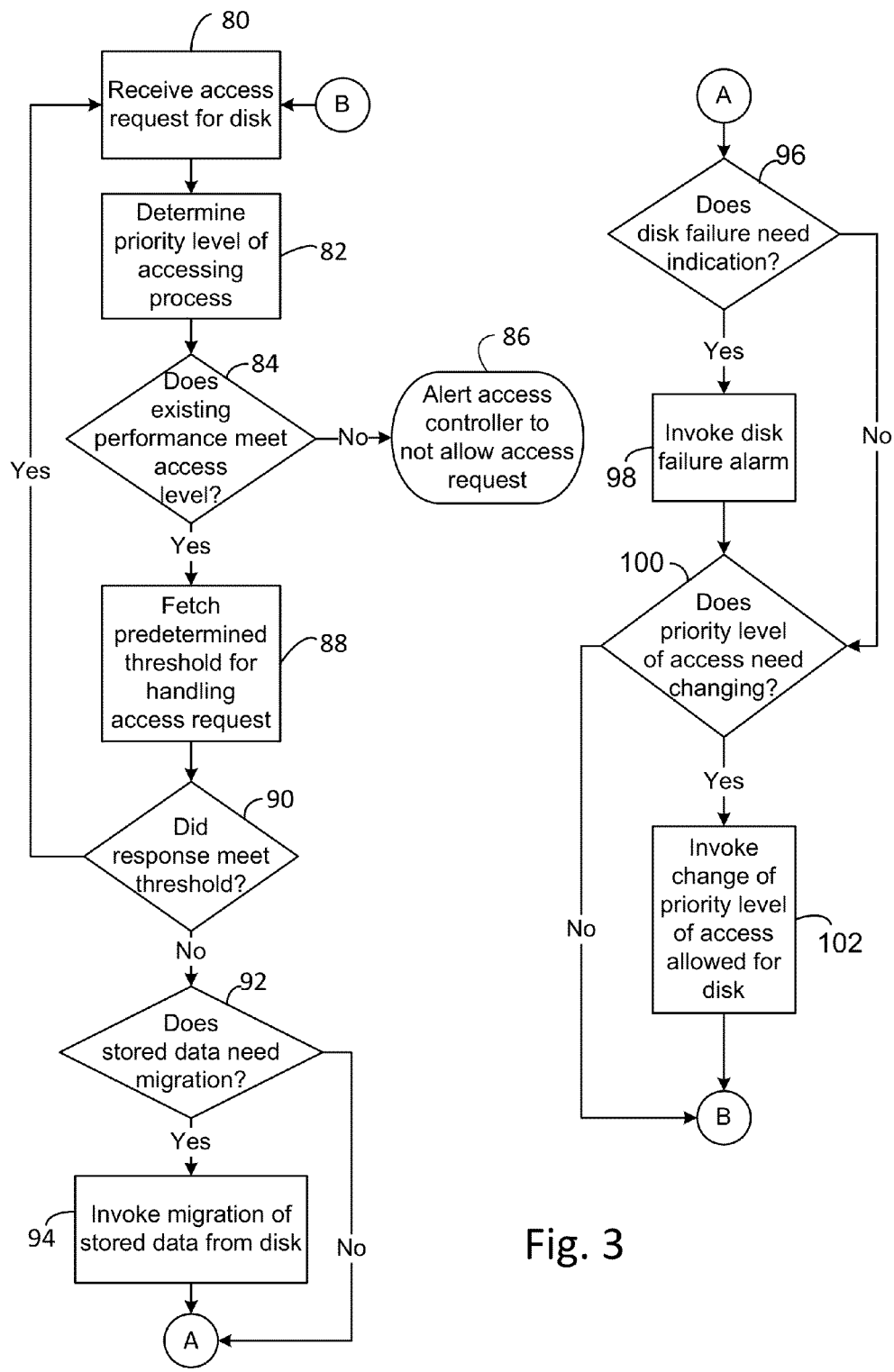
FIG. 3 is a flowchart of one embodiment of a process that monitors the handling of access requests by a disk volume and takes one or more actions based upon the response time of the disk volume failing below a predetermined threshold.

FIG. 3 is a flowchart of one embodiment of a process that monitors the handling of access requests by a storage volume 42 and takes one or more actions based upon the response time of the disk volume failing below a predetermined threshold. A request for access to the disk is received at step 80 (such as the Read/Write Request 50 in FIG. 2), and in this embodiment, the priority level of the accessing process is also determined as shown at step 82. Thus, when there may be multiple levels of services provided to requesting processes, the response monitor 54 can determine what the necessary threshold is for the incoming request. For example, if the request is from a calling virtual machine that has a priority level for high-speed response, the response monitor 54 can determine if that calling virtual machine has its response times met, as shown by decision 84. If the existing performance of the storage volume 42 is insufficient to meet the priority access level at decision 84, then the access controller 52 is alerted that the incoming request cannot be honored by the storage volume 42, and the process terminates for that incoming request, as shown at termination 86.

Otherwise, if the performance threshold can be met at decision 84, then the predetermined threshold for handling a request, i.e. the generalized optimal performance threshold for any storage volume 42 as opposed to the very specific threshold required for a priority level of service, is fetched at step 88, and a determination is then made as to whether the response to the access request met the predetermined threshold, as shown at decision 90. If the predetermined threshold was met at decision 90, the process then iterates to await the next incoming access request at step 80.

Otherwise, if the optimal performance threshold was not met at decision 90, then, a determination is made as to whether the data stored on the storage volume 42 needs to be migrated, as shown at decision 92. If migration is needed at decision 92, then the process of the migration of the stored data is invoked by the response monitor, as shown at step 94. The response monitor can control all, some or none of the actual migration of the stored data from the underperforming storage volume 42. Moreover, the migration of the data can move the data to any other storage media on the network, such as another storage volume in the array, the data center or across the network, and the storage media can be any type of media, e.g. magnetic disk drive, solid state storage, active computer memory, and can be held either temporarily or permanently at the new storage location. After the migration of the data at step 94, or otherwise upon no migration of data being needed at step 92, a determination is then made as to whether disk failure for the storage volume 42 needs to be indicated, as shown at decision 96. If disk failure indication is needed at decision 96, the disk failure alarm is invoked as shown at step 98. The response monitor 54 can likewise control all, some or none of the process of the disk failure alarm invocation.

After the invocation of the disk failure alarm at step 98, or otherwise if disk failure indication is not needed at decision 96, then a determination is made as to whether the priority level of access for that storage volume 42 needs to be changed, as shown at decision 100. If the priority level needs changing at decision 100, then the routine for changing the level of priority for the access of the disk is invoked, as shown at step 102. For example, if the response times for the storage volume 42 are slow, but still responsive to incoming access request, the storage volume 42 can have a priority level set to handle incoming access requests having a low priority level.

The response monitor 54 can likewise control all, some or none of the process of the invocation of the priority level change. After step 102, or otherwise if a change of priority level for access requests is not needed at decision 100, the process then iterates to step 80 to await another incoming access request to the storage volume 42.

It should be noted that the exemplary response monitor 54 can take only one response, such as data migration at step 94, or a variety of steps dependent upon how embodied. Thus, the listed actions in FIG. 3 of data migration (step 94), disk failure alarm (step 98), and change of priority level for access requests (step 102) can be done in any order, or any step can be omitted from the process. It should also be appreciated that other processes can be invoked for use with the response monitor to effectuate whatever response is desired for storage volume 42 underperformance.

Figure 4:
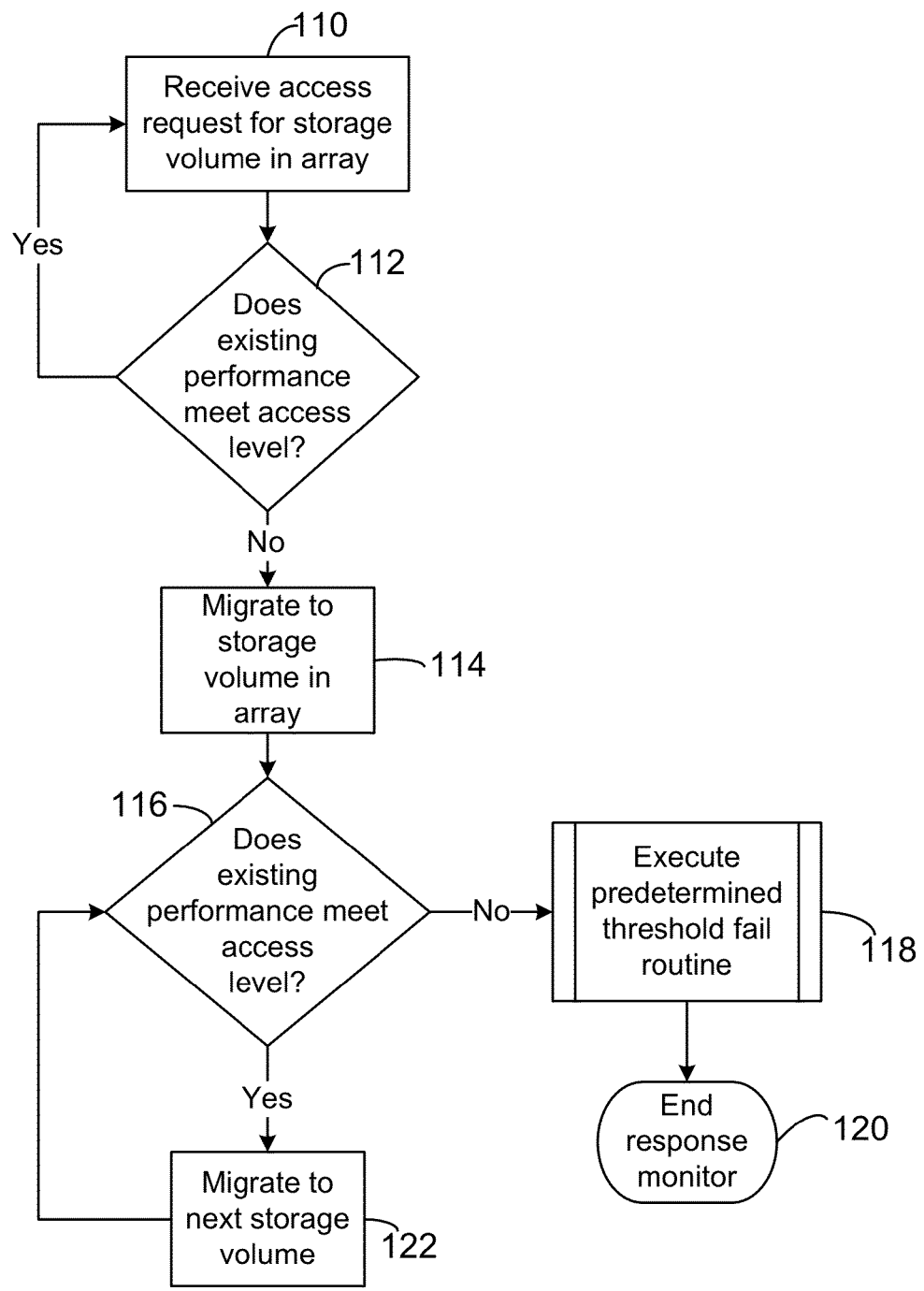
FIG. 4 is a flowchart of one embodiment of a process of a response monitor resident in a node of a disk storage array wherein the response monitor will migrate through individual storage volumes and other nodes of the array to locate underperforming devices.

FIG. 4 is a flowchart of one embodiment of a process of a response monitor 54 resident in a node of a disk storage array, such as node manager 28, Block Storage System Manager 38 or Server Block Data Storage Systems 40 in FIG. 1, wherein the response monitor 54 will migrate through individual storage volumes 42, and/or other nodes of the array to locate underperforming storage devices. In this embodiment, an access request for a storage volume 42 in the storage array is received, as shown at step 110, and then a determination is made as to whether the performance level of the throughput of that node meets the predetermined time threshold of response for the access request, as shown at decision 112. Thus, in this embodiment, the response monitor 54 is looking at an aggregated statistic, such as request handling throughput or overall response time, at the node. If the access request has been handled in a timely manner, meeting the predetermined threshold at decision 112, then the process iterates to step 110 to again await another access request.

Otherwise, if the predetermined threshold has not been met at decision 112, then the response monitor 54 will migrate to at least one storage volume 42 within the array, as shown at step 114. Once located at the at least one storage volume 42, the response monitor will then make a determination as to whether that storage volume 42 meets the performance threshold in handling access requests, as shown at decision 116. In essence, once located at the storage volume 42, the response monitor 54 will execute a process similar to that shown in FIG. 3. Thus, if the performance threshold is not met at decision 116, the predetermined processes for handling threshold failure are executed, as shown at step 118, (which could be similar to the process that occurs after failure at decision 90 in FIG. 2) and then the response monitor 54 is terminated at that storage volume as is shown at termination 120. Otherwise, in this embodiment, if the performance threshold is met at that storage volume at decision 116, the response monitor 54 will migrate to the next storage volume 42, as shown at step 122, the process of review of the performance of that next storage volume will iterate by return to decision 116.

Thus, in this embodiment, the response monitor 54 will "walk" through the storage volumes 42 in the storage array until it finds the underperforming storage volume causing the overall performance of the array to suffer. In this embodiment, the response monitor 54 does not cause overhead to the individual storage volumes 42 until a problem with array performance has been indicated. Consequently, upon finding no threshold problem in servicing access requests in an individual storage volume 42, then response monitor 54 will then delete the local copy 120 to remove the overhead. However, it should be appreciated that the process shown in FIG. 4 can be done in parallel, with the response monitor 54 pushed out to all storage volumes 42 of the array at once, or the response monitor 54 can sequentially march through the array, as shown in FIG. 4.

It will be appreciated that in some embodiments the functionality provided by the routines discussed above may be provided in alternative ways, such as being split among more routines or consolidated into fewer routines. Similarly, in some embodiments, illustrated routines may provide more or less functionality than is described, such as when other illustrated routines instead lack or include such functionality respectively, or when the amount of functionality that is provided is altered. In addition, while various operations may be illustrated as being performed in a particular manner (e.g., in serial or in parallel) and/or in a particular order, in other embodiments the operations may be performed in other orders and in other manners. Similarly, the data structures discussed above may be structured in different manners in other embodiments, such as by having a single data structure split into multiple data structures or by having multiple data structures consolidated into a single data structure, and may store more or less information than is described (e.g., when other illustrated data structures instead lack or include such information respectively, or when the amount or types of information that is stored is altered).

What is claimed is:

1. A system for optimizing the access performance of a storage array, comprising:
   a plurality of storage disks that are accessible across a network;
   an access controller that receives requests for access to the plurality of storage disks from the network, the access requests being serviced by one or more of the plurality of storage disks; and
   a response monitor that monitors the service of each access request by the one or more of the plurality of storage disks, and the response monitor further determines the performance of the plurality of disks in handling each access request based upon, at least, a predetermined time threshold for the handling of said access request upon determining that the performance of the plurality of storage disks does not meet the predetermined threshold, causes data stored on the plurality of storage disks to be migrated.

2. The system of claim 1, wherein:
   the access requests are from a plurality of computer processes across the network, and access requests are comprised of at least two priority levels of service; and
   the response monitor, upon determining that the performance of the plurality of storage disks does not meet the predetermined threshold, causes data stored in the plurality of storage disks for at least one priority level of service for access requests to be migrated to one or more other storage disks that provide access request service, at least, at the predetermined threshold for that priority level of service.

3. The system of claim 1, wherein the response monitor, upon determining that the performance of the plurality of storage disks does not meet the predetermined threshold, indicates impending disk failure within the plurality of storage disks.

4. The system of claim 1, wherein the predetermined time threshold is dynamically adjusted for each access request based upon the performance of the plurality of storage disks to access requests.

5. The system of claim 1, wherein the response monitor further determines the performance of the plurality of disks in handling each access request based upon multiple predetermined time thresholds for the handling of said access request.

6. A system for optimizing the access performance of at least one storage disk, comprising:
   at least one storage disk that is accessible across a network;
   an access controller that receives requests for access to the at least one storage disk from the network; and
   a response monitor that monitors the service of each access request by the at least one storage disk, and the response monitor further determines the performance in handling each access request based upon, at least, a predetermined time threshold for the handling of said access request wherein the response monitor, upon determining that the performance of the at least one storage disk does not meet the predetermined threshold, causes data stored on the at least one storage disk to be migrated to another storage accessible across the network.

7. The system of claim 6, wherein:
   the access requests are from a plurality of computer processes across the network, and the access requests comprised of at least two priority levels of service; and
   the response monitor, upon determining the performance of the at least one storage disk does not meet the predetermined threshold for a priority level of service, limits access requests having that priority level of service to the at least one storage disk.

8. The system of claim 6, wherein the response monitor, upon determining the performance of the at least one storage disk does not meet the predetermined threshold, indicates disk failure.

9. The system of claim 6, wherein the access controller is resident on the at least one storage disk.

10. The system of claim 6, wherein the access controller is located remotely from the at least one storage disk.

11. The system of claim 6, wherein the response monitor is resident on the at least one storage disk.

12. The system of claim 6, wherein the response monitor is located remotely from the at least one storage disk.

13. The system of claim 6, wherein the access request includes either a read request or a write request.

14. The system of claim 6, further comprising a plurality of storage disks that are accessible across a network, and wherein the predetermined time threshold is dynamically adjusted for each access request to the at least one storage disk based upon the performance of the plurality of storage disks to access requests.

15. The system of claim 6, wherein the response monitor further determines the performance of the at least one storage disk in handling each access request based upon multiple predetermined time thresholds for the handling of said access request.

16. A response monitor, comprising:
    at least one computing device configured to:
    monitor the servicing of access requests to at least one storage disk made across a network; and
    determine the performance of the at least one storage disk in handling each access request based upon, at least, a predetermined time threshold for the handling of said access request;
    cause data stored on the at least one storage disk to be migrated to another storage accessible across the network upon determining that the performance of the at least one storage disk does not meet the predetermined time threshold.

17. The response monitor of claim 16, wherein:
the access requests are from a plurality of computer processes across the network, and the access requests comprised of at least two priority levels of service; and
the response monitor, upon determining the performance of the at least one storage disk does not meet the predetermined threshold for a priority level of service, limits access requests having that priority level of service to the at least one storage disk.

18. The response monitor of claim 16, wherein the response monitor, upon determining the performance of the at least one storage disk does not meet the predetermined threshold, indicates disk failure.

19. The response monitor of claim 16, wherein the access request includes a read request or a write request.

20. The response monitor of claim 16, wherein the response monitor is resident on the at least one storage disk.

21. The response monitor of claim 16, wherein the response monitor is located remotely from the at least one storage disk.

22. The response monitor of claim 21, wherein the response monitor is located at a node that controls the access requests to a plurality of storage disks, and the response monitor determines the performance of the plurality of storage disks in handling access requests.

23. The response monitor of claim 22, wherein:
the access requests are from a plurality of computer processes across the network, and the access requests comprised of at least two priority levels of service; and
the response monitor selectively migrates from the node to at least one of the plurality of storage disks upon the response monitor determining the performance of the plurality of storage disks does not meet the predetermined threshold for at least one priority level of service of access requests.

24. The response monitor of claim 22, further comprising a plurality of storage disks that are accessible across a network, and wherein the predetermined time threshold is dynamically adjusted for each access request to the at least one storage disk based upon the performance of the plurality of storage disks to access requests.

25. The response monitor of claim 16, wherein the response monitor further determines the performance of the at least one storage disk in handling each access request based upon multiple predetermined time thresholds for the handling of said access request.

26. A method for optimizing the access performance of at least one storage disk, comprising:
receiving one or more requests for access to the at least one storage disk from a network for at least one storage disk that is accessible across a network;
monitoring the service of each access request by the at least one storage disk;
determining the performance in handling each access request based upon, at least, a predetermined time threshold for the handling of said access request; and
migrating data stored on the at least one storage disk to another storage accessible across the network upon determining that the performance in handling each access request does not meet the predetermined threshold.

27. The method of claim 26, wherein:
the access requests are from a plurality of computer processes across the network, and the access requests comprised of at least two priority levels of service; and
upon determining the performance of the plurality of storage disks does not meet the predetermined threshold for a priority level of service, limiting access requests having that priority level of service to the at least one storage disk.

28. The method of claim 26, wherein upon determining the performance of the plurality of storage disks does not meet the predetermined threshold, indicating a disk failure.

29. The method of claim 26, wherein receiving one or more access requests includes receiving either a read request or a write request to the at least one storage disk.

30. The method of claim 26, further comprising:
receiving access requests at a node to a plurality of storage disks; and
determining the performance of the plurality of storage disks in handling access requests, such determination occurring at a response monitor resident at the node.

31. The method of claim 30, wherein the access requests are from a plurality of computer processes across the network, and the access requests comprised of at least two priority levels of service, and further comprising:
determining if the performance of the plurality of storage disks does not meet the predetermined threshold; and
migrating the response monitor from the node to at least one of the plurality of storage disks upon the determination that the performance does not meet the threshold.

32. The method of claim 26, wherein the at least one storage disk is within a plurality of storage disks receiving access requests, and further comprising dynamically adjusting the predetermined time threshold for each access request to the at least one storage disk based upon the performance of the plurality of storage disks to access requests.

33. The method of claim 26, further comprising determining the performance in handling each access request based upon multiple predetermined time thresholds for the handling of said access request.

* * * * *